United States Patent [19]

Kodama et al.

[11] 4,453,231

[45] Jun. 5, 1984

[54] MAGNETIC BUBBLE MEMORY

[75] Inventors: Naoki Kodama, Hachioji; Ryo Suzuki, Kodaira; Masatoshi Takeshita, Hachioji; Yutaka Sugita, Tokorozawa, all of Japan

[73] Assignee: Hitachi, Ltd., Tokyo, Japan

[21] Appl. No.: 446,518

[22] Filed: Dec. 3, 1982

[30] Foreign Application Priority Data

Dec. 4, 1981 [JP] Japan ................................ 56-194520

[51] Int. Cl.$^3$ ............................................. G11C 19/08
[52] U.S. Cl. ........................................ 365/36; 365/15; 365/43
[58] Field of Search ............................ 365/15, 36, 43

[56] References Cited

U.S. PATENT DOCUMENTS 4,086,572  4/1978  Bullock .................................. 365/36
4,360,904  11/1982  Gergis .................................... 365/36

*Primary Examiner*—James W. Moffitt
*Attorney, Agent, or Firm*—Antonelli, Terry & Wands

[57] ABSTRACT

A magnetic bubble memory has a first bubble propagation track formed with an ion-implanted pattern and a second bubble propagation track formed with permalloy members connected to each other to form a storage loop. The arrangement is such that a position of an attractive magnetic pole created in one of the permalloy members coincides with a position of an attractive charged wall appearing in the ion-implanted layer at a junction of the first and second bubble propagation tracks when a driving magnetic field is in a particular range of direction.

9 Claims, 8 Drawing Figures

MAGNETIC BUBBLE MEMORY

The present invention relates to a memory for storing information in a form of cylindrical magnetic bubble domains or so-called magnetic bubbles, and more particularly to such a memory having bubble propagation tracks formed by an ion-implanted pattern and bubble propagation tracks made of soft magnetic material.

In order to achieve a high density and highly integrated magnetic bubble memory, a memory having magnetic bubble propagation tracks formed by an ion-implanted pattern has been proposed. In such a memory, ions such as He+ are implanted in accordance with a predetermined pattern on a surface of a bubble supporting layer in which bubbles can be held and moved to form areas in which magnetization is oriented in a plane parallel to the bubble supporting layer to form the bubble propagation tracks. Since the propagation tracks are formed by a gap-free pattern, they are readily fabricated by lithography which is advantageous to high integration density of the elements. However, in order to complete the magnetic memory, storage loops formed by the propagation tracks as well as portions for performing bubble generation, replication and detection are necessary. Thus, it is difficult to attain a replicate gate for replicating from the propagation tracks of the ion-implanted pattern.

On the other hand, in a magnetic bubble memory having bubble propagation tracks formed by arranging a soft magnetic material such as permalloy above the bubble supporting layer, it is easy to attain the function of magnetic bubble replication and detection but high package density of elements is restricted because of a dimensional limit of a pattern-to-pattern gap.

It is an object of the present invention to provide a connecting structure having bubble propagation tracks formed with an ion-implanted pattern and bubble propagation tracks formed with soft magnetic material.

In accordance with a feature of the present invention, arranged on a first kind of bubble propagation tracks formed with the ion-implanted pattern is one of soft magnetic elements which form a second kind of bubble progagation tracks in an overlapped relation so that when a driving magnetic field rotating in a plane of a bubble supporting layer is directed to a particular direction, a position of an attractive magnetic pole appearing in the soft magnetic element coincides with a position of an attractive charged wall appearing on the first kind of bubble propagation tracks.

By connecting the first kind of bubble propagation tracks formed with the ion-implanted pattern and the second kind of bubble propagation tracks made of soft magnetic material by the connecting structure of the present invention to form a storage loop, a magnetic bubble memory in which the bubble propagation cycle is not delayed at the junction or the bubbles are not extinguished is provided.

The present invention will be apparent from the following detailed description taken in conjunction with the accompanying drawings, in which.

Figure 1:
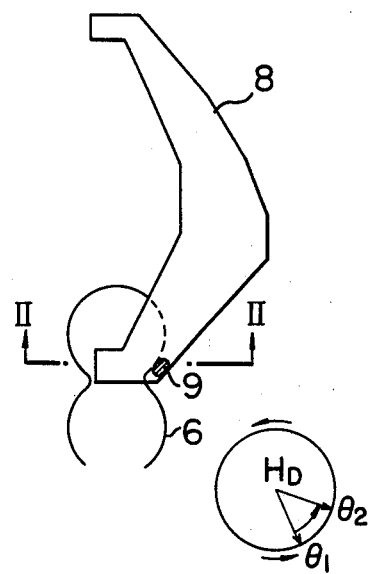
FIG. 1 shows a plan view of a bubble propagation track junction in one embodiment of the present invention.
Figure 2:
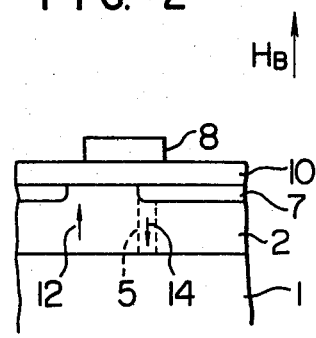
FIG. 2 shows a sectional view taken along a line II—II in FIG. 1.

FIG. 1 shows a bubble propagation track junction in one embodiment of the present invention and FIG. 2 shows a sectional view taken along a line II—II in FIG. 1. A cylindrical magnetic bubble domain or so-called magnetic bubble 5 appears under a predetermined magnitude of a biasing magnetic field $H_B$ in a magnetic garnet film 2 formed on a garnet substrate 1. An arrow 14 shows a magnetization of the magnetic bubble domain and an arrow 12 shows a magnetization outside of the magnetic bubble domain. An ion-implanted region 7 is formed with ion-implantation of H+ on a surface of the magnetic garnet film 2 and the magnetization thereof is oriented in a plane direction of the magnetic garnet film. An ion-implanted propagation track 6 is formed with the ion-implanted pattern. In accordance with the in-plane oriented magnetic field, an attractive charged wall which attracts the magnetic bubble 5 and a repulsive charged wall which repels the magnetic bubble 5 appear at the edge of the ion-implanted region 7. The attractive charged wall is moved along the pattern 6 by a driving magnetic field $H_D$ which rotates in the plane to propagate the magnetic bubble. An insulative layer 10 is disposed on the magnetic garnet film 2. A permalloy member 8 is disposed on the insulative layer. The magnetic bubble propagated along the propagation track 6 is attracted by the attractive magnetic pole created at the end of the permalloy member 8 and then propagates along the outer periphery of the permalloy member 8. In this manner, a junction for propagating the magnetic bubble from the bubble propagation track formed with the ion-implanted pattern to the bubble propagation track formed with the permalloy member is formed.

A characteristic feature in the junction resides in that the permalloy member 8 is arranged such that the position of the attractive magnetic pole appearing in the permalloy member 8 coincides with the position of the attractive charged wall when the driving magnetic field $H_D$ rotates in a range between $\theta_1$ and $\theta_2$. A region 9 shown in FIG. 1 indicates the coincide region of the both. By the presence of coincidence time of the position of the attractive charged wall and the position of the attractive magnetic pole, the propagation of the magnetic bubble from the propagation track formed with the ion-implanted pattern to the propagation track formed with the permalloy member is assured. In the arrangement without such coincidence, propagation failure such as stop or exteinguishment of the magnetic bubble at the junction or the propagation of the magnetic bubble in other than desired direction occurs, and the behavior of the magnetic bubble at the junction may change depending on the presence or absence of the magnetic bubble at a bit next to the propagated magnetic bubble.

Figure 3:
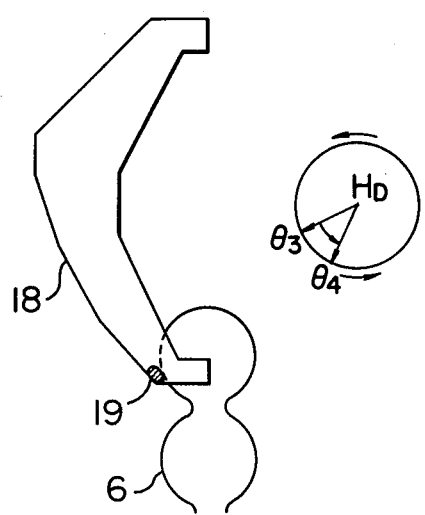
FIGS. 3, 4 and 5 show plan views of other junctions.

FIG. 3 shows an embodiment of the junction for propagating the magnetic bubble from the bubble propagation track formed of the permalloy member 18 to the bubble propagation track 6 formed of the ion-implanted pattern. In the present embodiment, the arrangement is such that the position of the attractive magnetic pole created in the permalloy member 18 coincides with the position of the attractive charged wall appearing in the bubble propagation track 6 when the driving magnetic field $H_D$ rotates in the range between $\theta_3$ and $\theta_4$. A region 19 indicates a coincident region of the both. Thus, in the arrangement which is opposite to that of FIG. 1, by the presence of the coincidence time of the attractive magnetic pole of the permalloy element and the attractive charged wall on the bubble propagation track formed by the ion-implanted pattern, the propagation of the magnetic bubble between the two types of propagation tracks is attained without the extinguishment or the propagation phase delay of the magnetic bubble.

Figure 4:
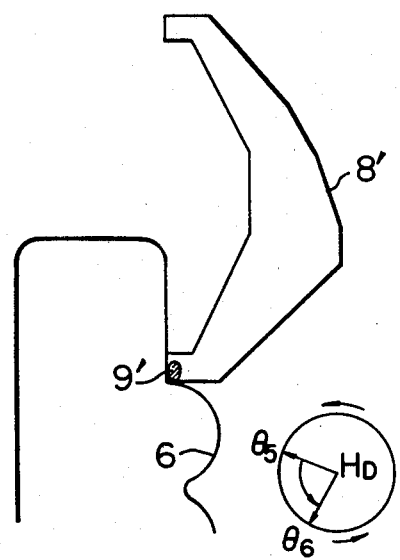

FIG. 4 shows a modification of the embodiment of FIG. 1, in which the position of the junction is altered. The position of the attractive magnetic pole created in a permalloy member 8' coincides with the propagation track 6 formed of the ion-implanted pattern when the driving magnetic field $H_D$ is directed between $\theta_5$ and $\theta_6$. A region 9' indicates a coincident region of the both.

Figure 5:
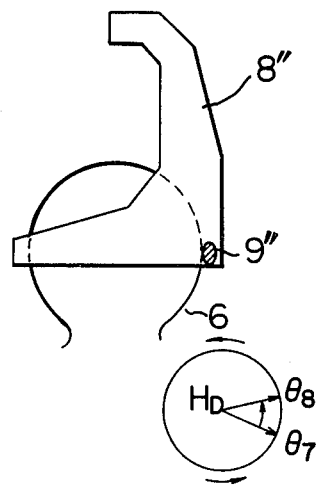

FIG. 5 shows a modification of the embodiment of FIG. 1, in which a shape of a permalloy member 8" is altered. When the driving magnetic field $H_D$ is directed between $\theta_7$ and $\theta_8$, the position of the attractive magnetic pole created in the permalloy member 8" coincides with the position of the attractive charged wall on the bubble propagation track formed by the ion-implanted pattern within a region 9".

In the embodiments of FIGS. 4 and 5, like the embodiment of FIG. 1, the propagation of the magnetic bubble to the permalloy member is assured.

Figure 6:
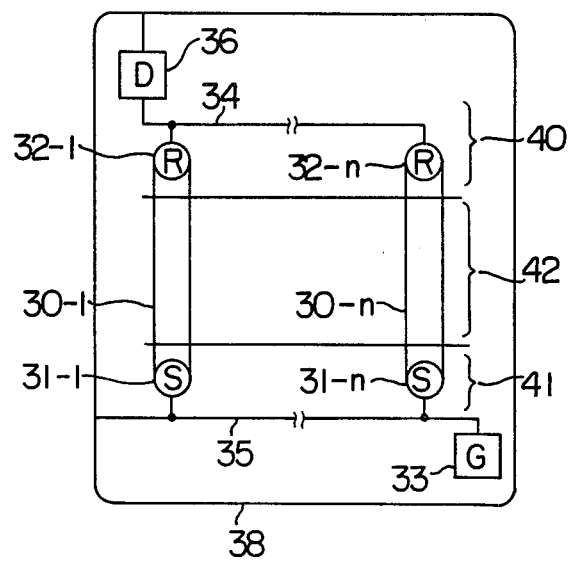
FIG. 6 shows a plan view of an overall configuration of another embodiment of the present invention.

FIG. 6 shows a chip configuration of a magnetic bubble memory in accordance with a further embodiment of the present invention.

A plurality of storage loops (called minor loops) 30-1, ... 30-n are arranged on the memory chip and they are coupled to a write propagation track 35 by swap gates 31-1, ... 31-n. The write propagation track 35 extends from a bubble generator 33 to a guard rail 38. The storage loops 30-1, ... 3-n are connected to a read propagation track 34 by replicate gates 32-1, ... 32-n. A bubble detector 36 is provided in the read propagation track 34.

Portions of the storage loops which are in a region 42 are formed by propagation tracks formed by the ion-implanted pattern and portions which are in regions 40 and 41 are formed by propagation tracks formed by the permalloy members.

Writing of data into the storage loops is effected by activating the bubble generator 33 in accordance with the data, propagating the generated magnetic bubbles along the write propagation track 35 and activating the swap gates 31-1, ... 31-n at appropriate timing. The magnetic bubbles resident at the write addresses in the storage loops are propagated to the propagation track 35 through the swap gates 31-1, ... 31-n and swept out to the guard rail 38. Reading of data from the storage loops is effected by activating the replicate gates 32-1, ... 32-n at appropriate timing, replicating the presence or absence of the magnetic bubbles at desired addresses in the storage loops to the read propagation track 34 and detecting them by the bubble detector 36.

Figure 7:
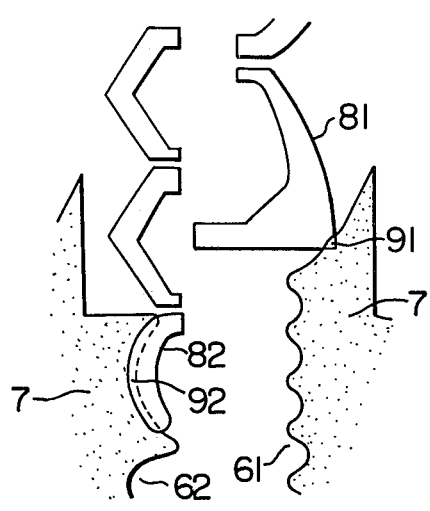
FIGS. 7 and 8 show bubble propagation track junctions in the embodiment of FIG. 6.
Figure 8:
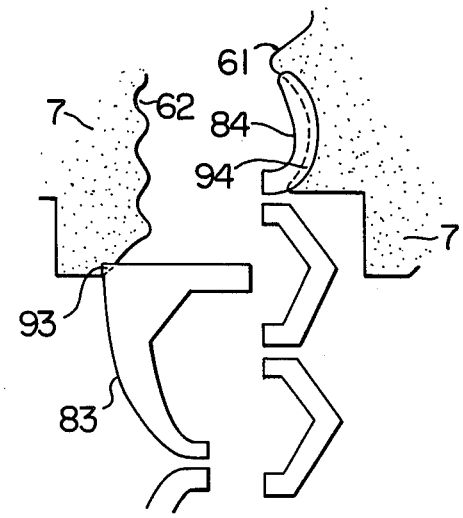

Two different bubble propagation track connecting portions for the storage loops are shown in FIGS. 7 and 8.

FIG. 7 shows a boundary of a region 40 and a region 42. A region 7 shows the ion-implanted region. The magnetic bubble is propagated from a propagation track 61 formed by the ion-implanted pattern to a permalloy member 81 through a junction 91, and the magnetic bubble is propagated from the permalloy member 82 to a propagation track 62 formed by the ion-implanted pattern through a junction 92.

FIG. 8 shows a boundary of a region 41 and the region 42. The magnetic bubble is propagated from the propagation track 62 to a permalloy member 83 through a junction 93 and from a permalloy member 84 to the propagation track 61 through a junction 94.

At the junctions 91, 92, 93 and 94, the arrangements are such that the attractive magnetic pole created in the permalloy member overlaps the attractive charged wall appearing on the propagation track formed by the ion-implanted pattern when the driving magnetic field is directed in a particular direction, as is the case of the previous embodiments.

In the present storage loop arrangement, the bubble propagation failure or the phase delay at the junction is avoided and the stored information is not destroyed. Since the replicate gates, the swap gates and the bubble detector are arranged on the propagation tracks formed by the permalloy elements, a highly reliable operation is attained.

We claim:

1. A magnetic bubble memory comprising:
   a bubble supporting layer made of a material capable of holding and propagating cylindrical magnetic bubble domains;
   a first bubble propagation track for propagating the magnetic bubble domains in accordance with a driving magnetic field rotating in a plane of said bubble supporting layer, said first bubble propagation track being formed with an ion-implanted pattern to a surface of said bubble supporting layer; and
   a second bubble propagation track connected to said first bubble propagation track for propagating the magnetic bubble domains in accordance with said driving magnetic field, said second bubble propagation track being formed with a plurality of soft magnetic members arranged on said bubble supporting layer;
   one of said soft magnetic members of said second bubble propagation track being overlapped on said first bubble propagation track at junction of said first and second bubble propagation tracks.

2. A magnetic bubble memory according to claim 1 wherein an attractive magnetic pole created in said one of soft magnetic members overlaps an attractive charged wall appearing on said first bubble propagation track at said junction of said first and second bubble propagation tracks when said driving magnetic field is directed in a particular range of direction.

3. A magnetic bubble memory according to claim 1, wherein said first and second bubble propagation tracks are connected to form a storage loop.

4. A magnetic bubble memory according to claim 2, wherein said first and second bubble propagation tracks are connected to form a storage loop.

5. A magnetic bubble memory comprising:
   a bubble supporting layer made of a material capable of holding and propagating cylindrical magnetic bubble domains;
   a storage loop formed on said bubble supporting layer for circulating the magnetic bubble domains in accordance with a driving magnetic bubble domains in accordance with a driving magnetic field rotating in a plane of said bubble supporting layer;
   said storage loop including a first kind of bubble propagation track formed with an ion-implanted pattern to a surface of said bubble supporting layer and a second kind of bubble propagation track formed with soft magnetic elements arranged on said bubble supporting layer, connected to each other;

a position of an attractive magnetic pole created in one of said soft magnetic elements coinciding with a position of an attractive charged wall appearing on said first kind of bubble propagation track at each of a first junction from said first kind of bubble propagation track to said second kind of bubble propagation track and a second junction from said second kind of bubble propagation track to said first kind of bubble propagation track when said driving magnetic field is directed in a particular range of direction.

6. A magnetic bubble memory according to claim 5 further comprising write means coupled to said second kind of bubble propagation track of said storage loop.

7. A magnetic bubble memory according to claim 6 wherein said write means includes magnetic bubble domain generating means, write propagation means formed with a bubble propagation track of said second kind and a swap gate for coupling said write propagation means and said storage loop.

8. A magnetic bubble memory according to claim 5 further comprising read means coupled to said second kind of bubble propagation track of said storage loop.

9. A magnetic bubble memory according to claim 8 wherein said read means includes a replicate gate coupled to said storage loop, read propagation means connected to said replicator gate and formed with a bubble propagation track of said second kind and a magnetic bubble domain detector coupled to said read propagation track.

* * * * *